United States Patent
Lin et al.

(10) Patent No.: US 9,074,735 B2
(45) Date of Patent: Jul. 7, 2015

(54) LIGHT EMITTING DIODE PACKAGE

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Chen-Hsiu Lin, New Taipei (TW); Chia-Hao Wu, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/230,352

(22) Filed: Mar. 31, 2014

(65) Prior Publication Data
US 2014/0299894 A1     Oct. 9, 2014

(30) Foreign Application Priority Data
Apr. 3, 2013    (CN) .......................... 2013 1 0115957

(51) Int. Cl.
| | | |
|---|---|---|
| H01L 33/00 | (2010.01) |
| F21K 99/00 | (2010.01) |
| H01L 33/60 | (2010.01) |
| H01L 33/40 | (2010.01) |
| H01L 33/10 | (2010.01) |
| H01L 33/48 | (2010.01) |
| F21Y 101/02 | (2006.01) |
| F21Y 105/00 | (2006.01) |

(52) U.S. Cl.
CPC . *F21K 9/00* (2013.01); *H01L 33/60* (2013.01); *H01L 33/405* (2013.01); *H01L 33/10* (2013.01); *H01L 2224/48091* (2013.01); *H01L 33/486* (2013.01); *F21Y 2101/02* (2013.01); *F21Y 2105/001* (2013.01)

(58) Field of Classification Search
CPC ............................. H01L 33/10; H01L 33/405
USPC ......... 257/88, 98, 99, 100, E33.056, E33.057, 257/E33.058, E33.059
See application file for complete search history.

(56) References Cited

U.S. PATENT DOCUMENTS

| | | | | |
|---|---|---|---|---|
| 4,475,794 | A * | 10/1984 | Baker et al. ................... | 427/534 |
| 4,643,518 | A * | 2/1987 | Taniguchi .................. | 359/218.1 |
| 7,612,385 | B2 * | 11/2009 | Kim et al. ....................... | 257/99 |
| 7,633,093 | B2 * | 12/2009 | Blonder et al. ................. | 257/81 |
| 8,497,586 | B2 * | 7/2013 | Kim et al. ..................... | 257/787 |
| 8,546,842 | B2 * | 10/2013 | Higuma et al. .................. | 257/99 |
| 8,828,526 | B2 * | 9/2014 | Ballou et al. .................. | 428/212 |
| 2006/0286470 | A1 * | 12/2006 | Wu et al. ...................... | 430/58.8 |
| 2011/0176301 | A1 * | 7/2011 | Liang et al. ................... | 362/231 |

* cited by examiner

*Primary Examiner* — Ida M Soward
(74) *Attorney, Agent, or Firm* — Li & Cai Intellectual Property (USA) Office

(57) ABSTRACT

A light emitting diode (LED) package including a substrate unit, a light emitting unit and an encapsulant. The substrate unit includes a metal substrate and a circuit board. The metal substrate has a first carrier portion and a second carrier portion. The second carrier portion is projected from the first carrier portion. The first carrier portion has a first carrier face. The second carrier portion has a second carrier face located higher than the first carrier face. The circuit board is disposed on the first carrier face, and the second carrier portion passes through the circuit board. The light emitting unit includes at least one LED chip disposed on the second carrier face of the second carrier portion, and the LED chip electrically connected to the circuit board. The encapsulant encapsulates the LED chip.

18 Claims, 13 Drawing Sheets

LIGHT EMITTING DIODE PACKAGE

BACKGROUND

1. Field of the Invention

The instant disclosure relates to a light emitting diode (LED) package; in particular, to a chip-on-board (COB) LED package.

2. Description of Related Art

Comparing the light-emitting diode (LED) to the traditional light source, LED is smaller in volume, energy saving, better light efficiency, longer lifespan, fast in response, and without producing heat radiation or poisonous mercury. Thus, LED has been widely used in recent years. The conventional illumination module is usually in a chip-on-board manner. For preventing the high temperature of the LED chips from affecting the overall efficiency, metal plate having desirable heat conductivity is adapted to facilitate heat dissipation. However, an insulation layer is usually disposed on the metal plate to electrically insulate the LED chips from the metal plate. The insulation layer is bad conductor of heat. Therefore, the insulation layer is poor in thermal resistance. In addition, the process of electroplating silver is usually applied on the surface of the substrate to enhance the lighting efficiency of LED package in the conventional process. However, electroplating silver results in sulfurization, and the sulfurization leads to degradation of light. Therefore, the life span of the product is decreased.

SUMMARY OF THE INVENTION

The instant disclosure provides a light emitting diode package resolving the disadvantages as mentioned above.

According to one embodiment of the instant disclosure, a light emitting diode (LED) package is provided. The metal substrate of the LED package can provide better heat dissipation without disposing an insulation layer between the LED chips and the metal substrate, and the process of silver electroplating is ignored in the mirror aluminum substrate. Therefore, the light degradation caused by sulfatizing can be avoided to prolong the life span of the product.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

First Embodiment

Figure 1:
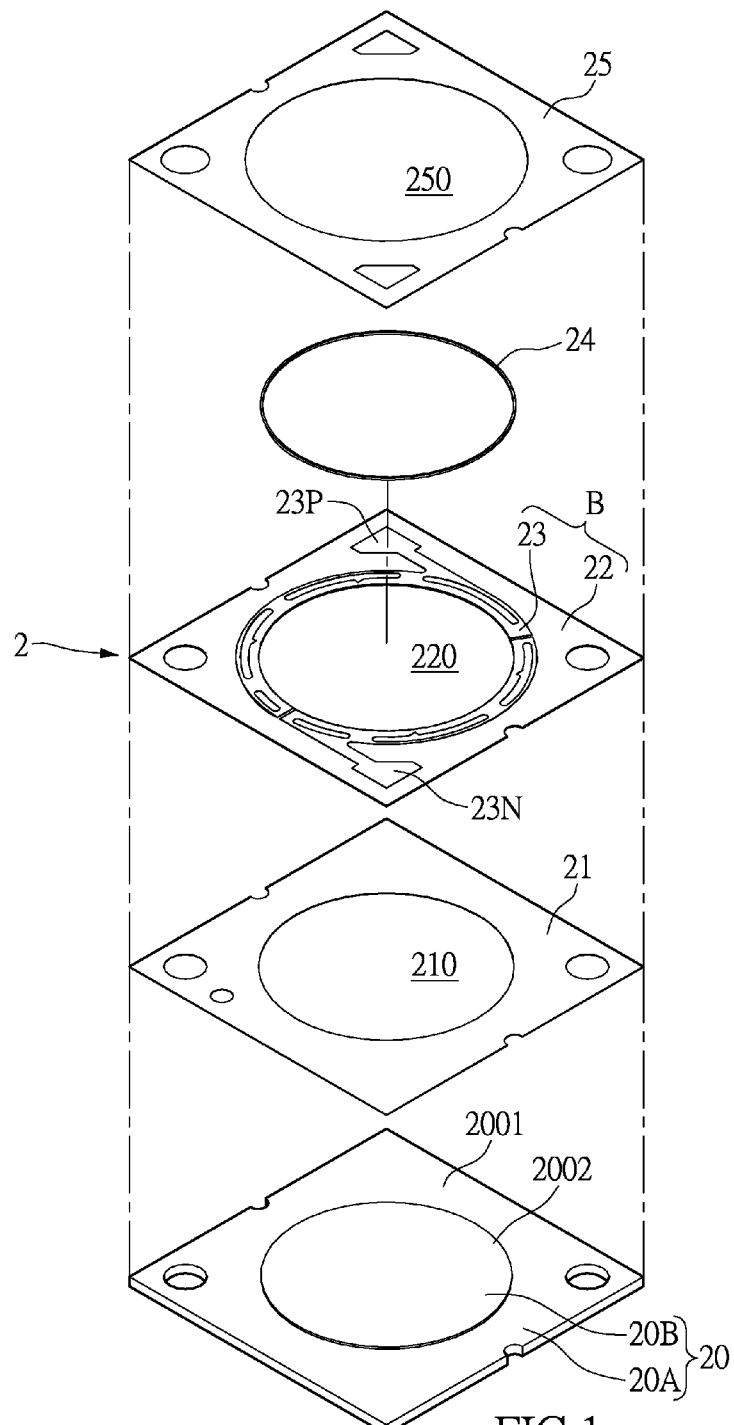
FIG. 1 is an exploded perspective view of the substrate unit in accordance with a first embodiment of the instant disclosure.
Figure 2:
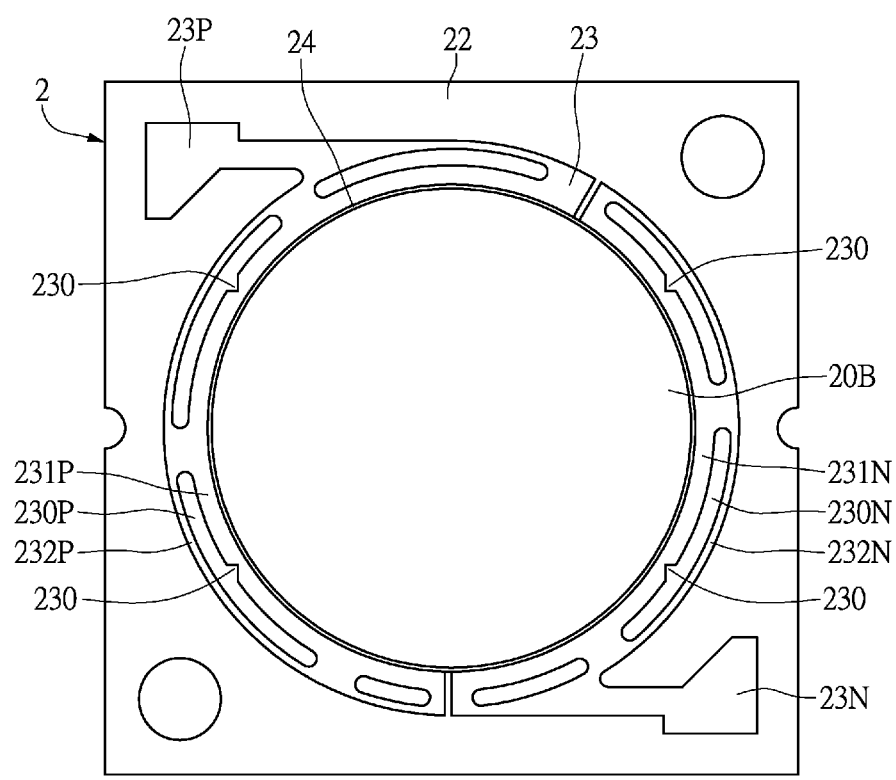
FIG. 2 is a top schematic view illustrating the substrate unit without a solder resist layer thereon.
Figure 3:
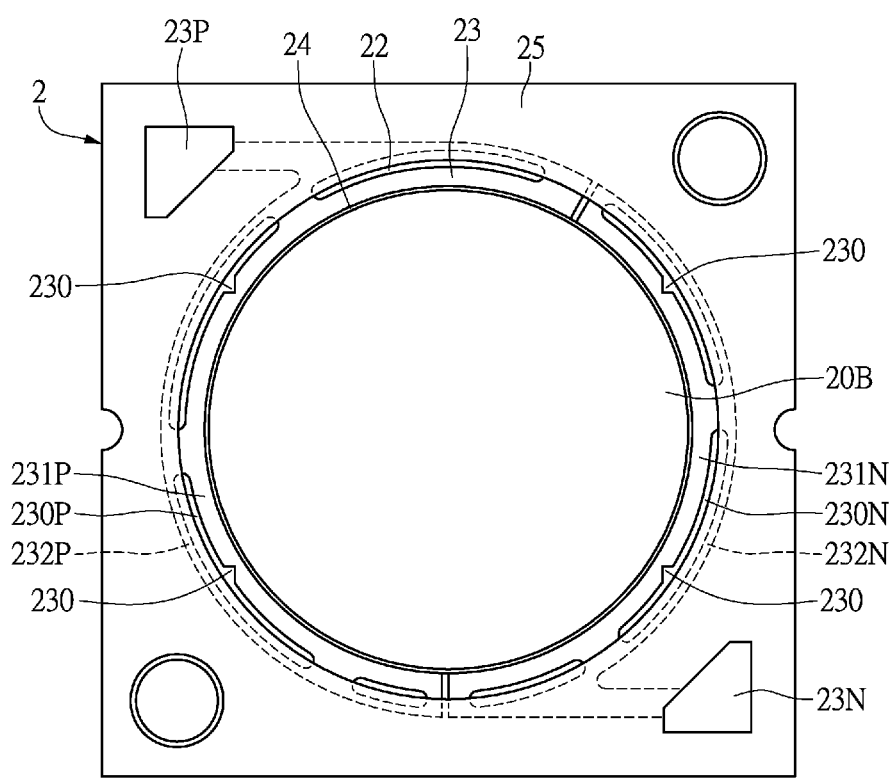
FIG. 3 is a top schematic view illustrating the substrate unit with the solder resist layer thereon.
Figure 4:
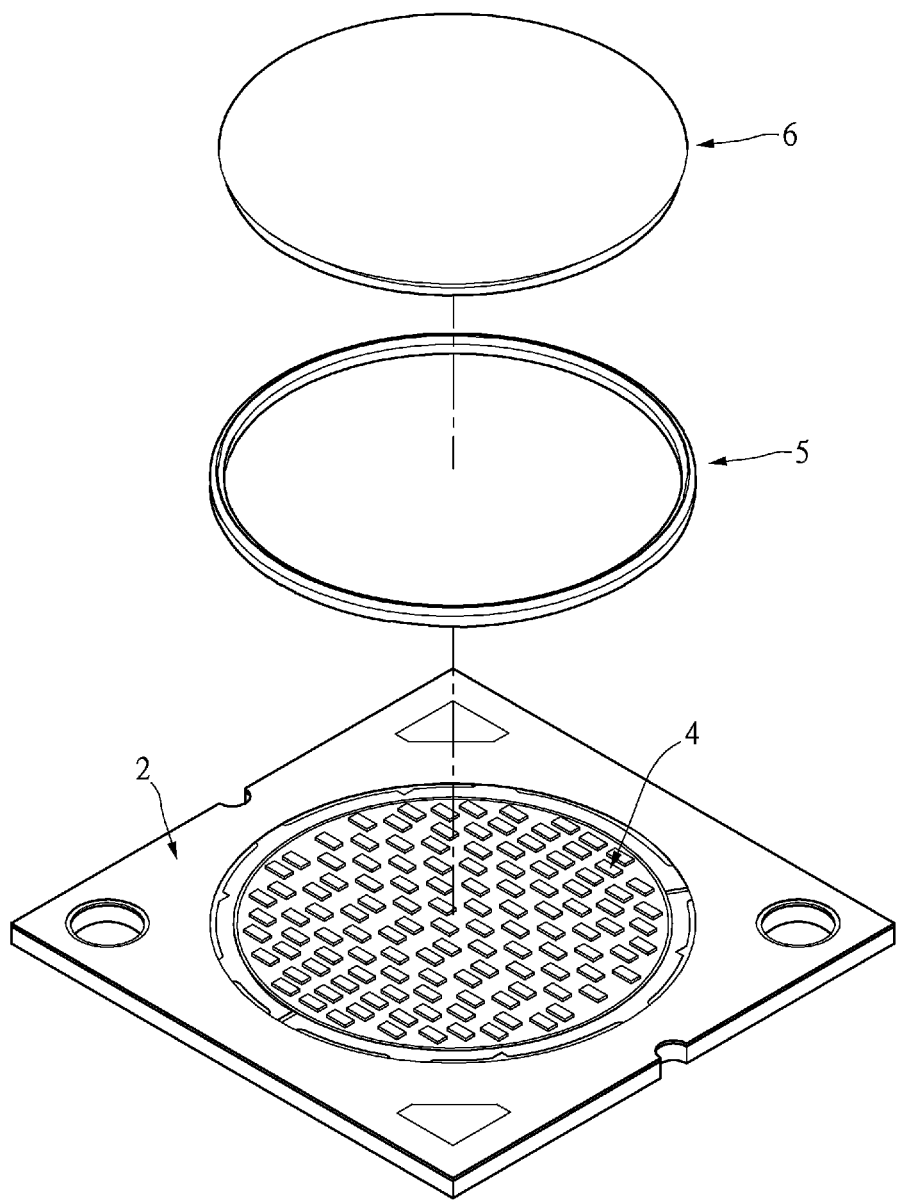
FIG. 4 is a partial exploded view illustrating the LED package in accordance with the first embodiment of the instant disclosure.
Figure 5A:
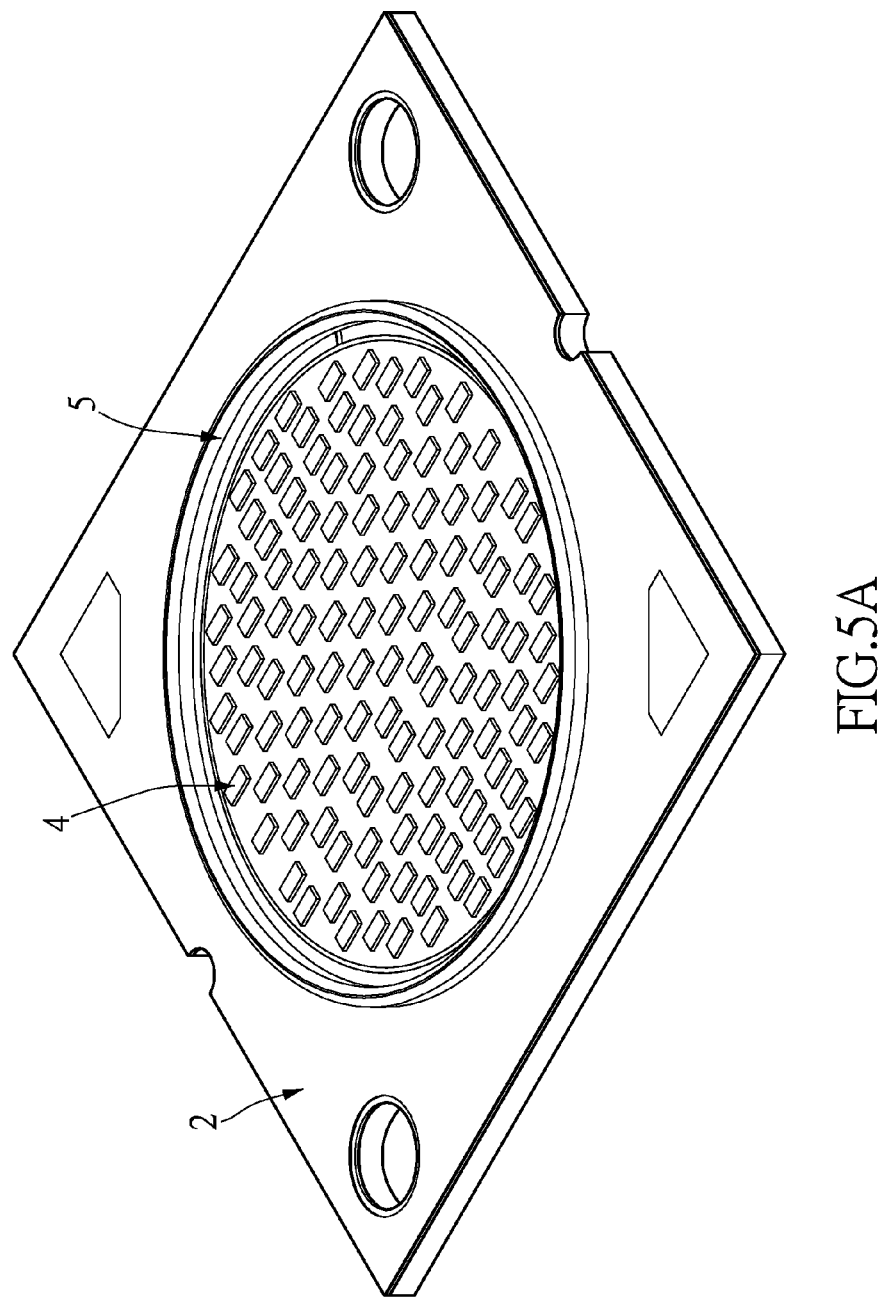
FIG. 5A is a perspective view illustrating the LED package that a reflective frame and a light emitting unit are disposed on the substrate unit in accordance with the first embodiment of the instant disclosure.
Figure 5B:
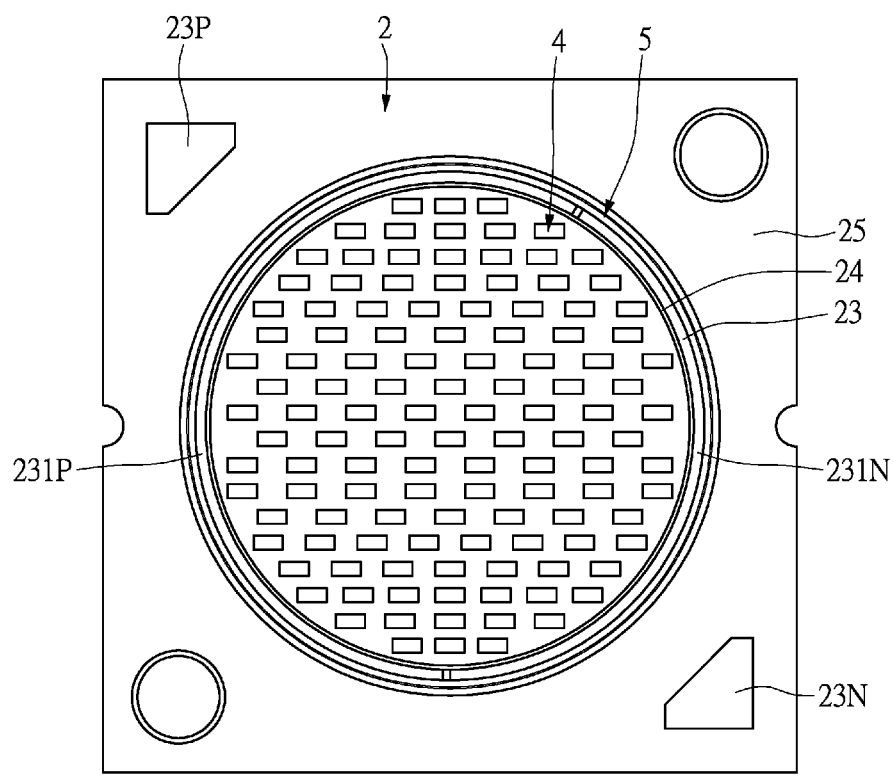
FIG. 5B is a top schematic view illustrating the LED package that the reflective frame and the light emitting unit are disposed on the substrate unit in accordance with the first embodiment of the instant disclosure.
Figure 6:
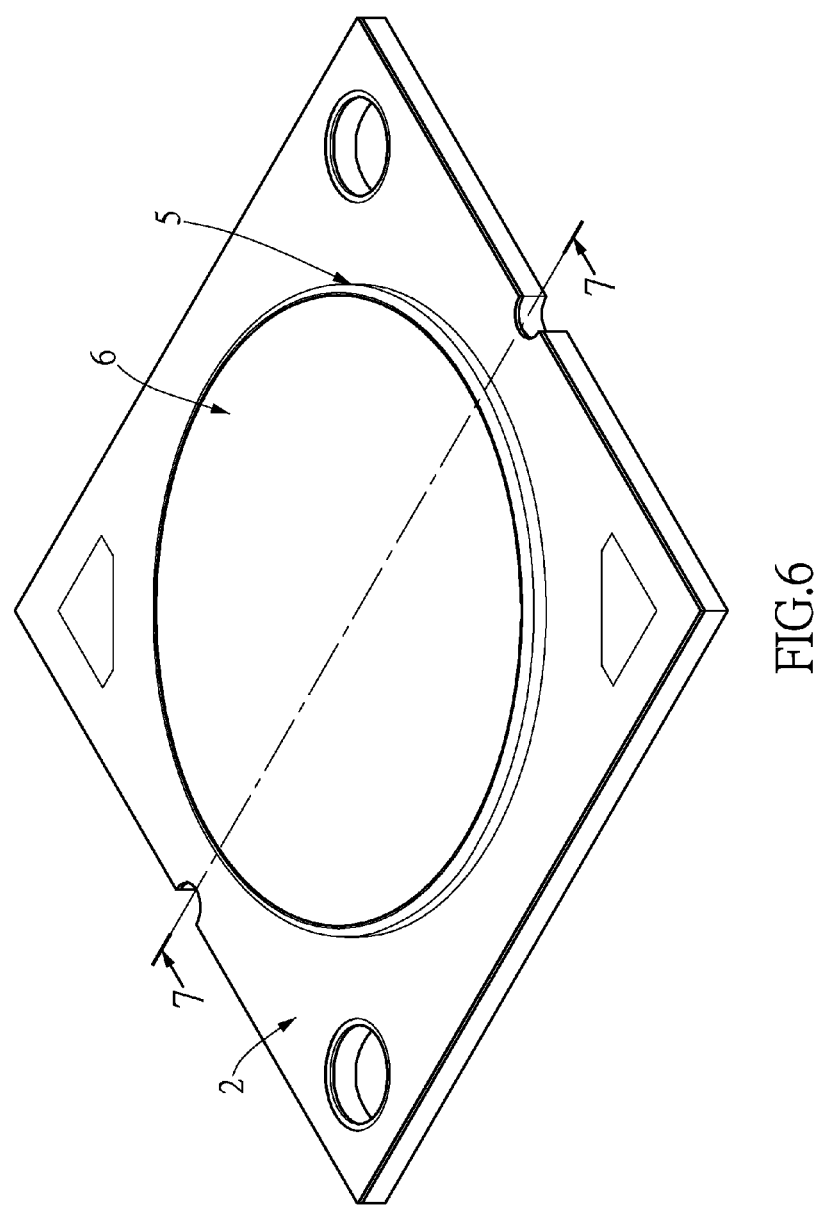
FIG. 6 is a perspective view illustrating the LED package in accordance with the first embodiment of the instant disclosure.

Referring to FIGS. 1 to 8, the instant disclosure provides a light-emitting diode (LED) package. The LED package includes a substrate unit 2, a light emitting unit 4, a reflective frame 5 and an encapsulant 6 (as shown in FIG. 4). The substrate unit 2 includes a metal substrate 20, an adhesive layer 21, a circuit board B, an insulating body 24 and a solder resist layer 25 (as shown in FIG. 1).

Figure 7:
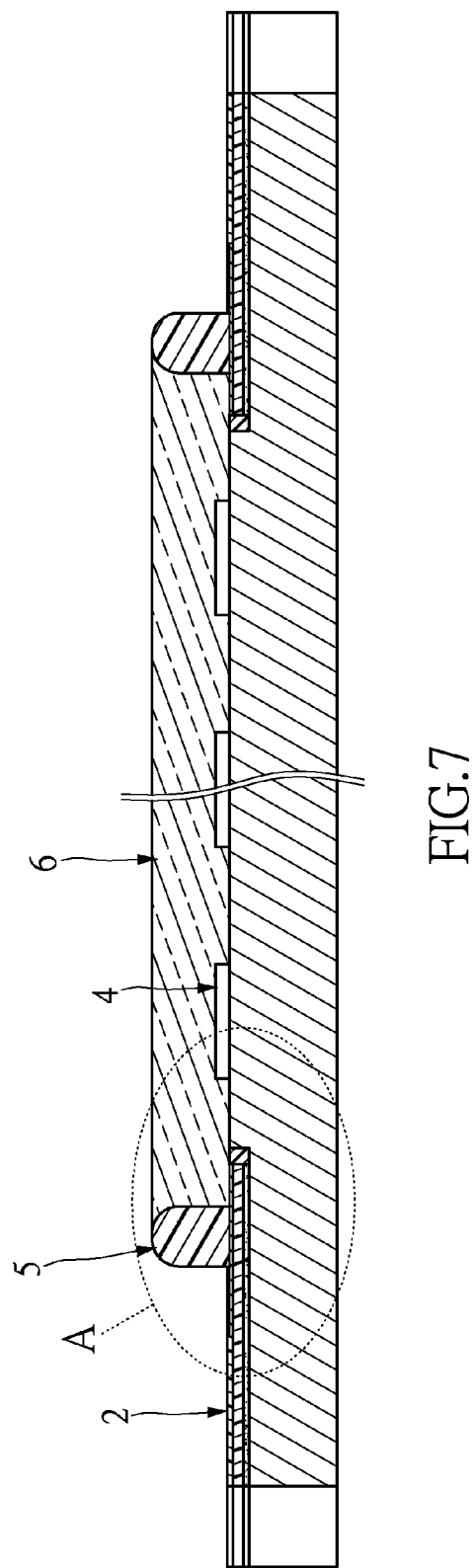
FIG. 7 is a cross-sectional view along line 7-7 of FIG. 6.
Figure 8:
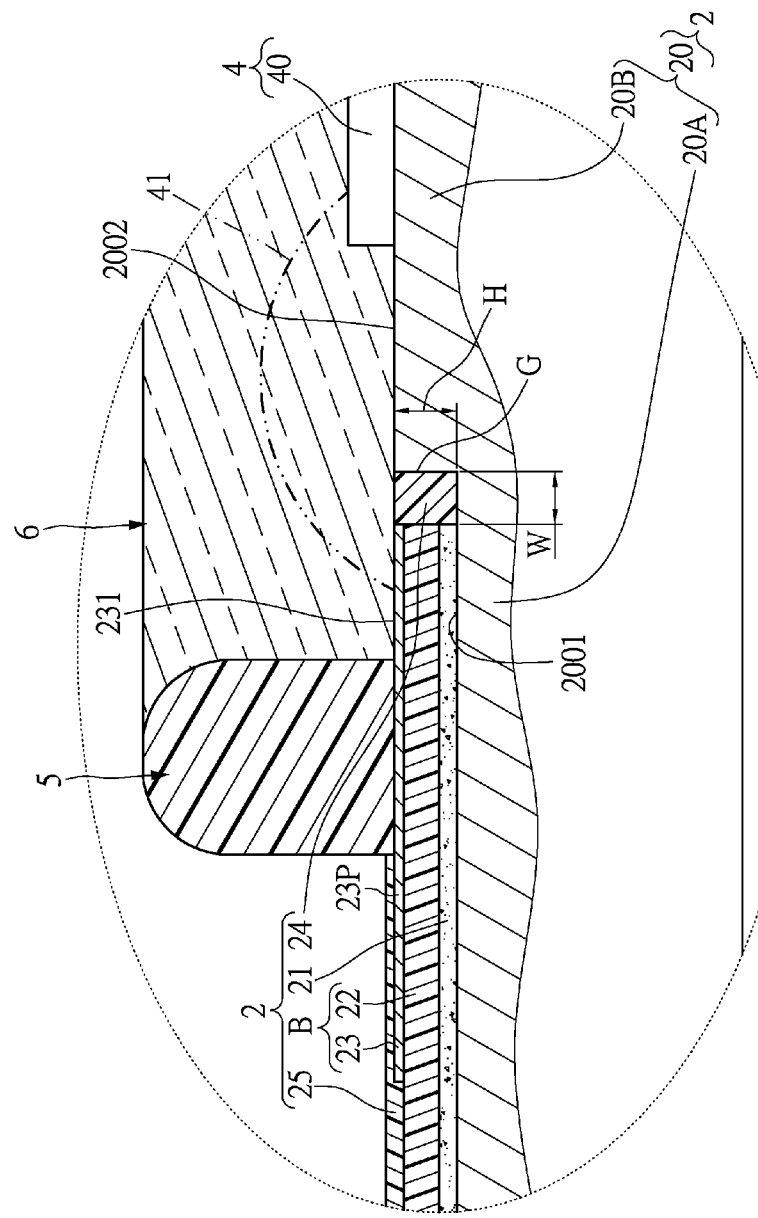
FIG. 8 is an enlarged view of part A of FIG. 7.

Refer to FIGS. 1, 7 and 8. The metal substrate 20 has a first carrier portion 20A and a second carrier portion 20B. The second carrier portion is protruded from the first carrier portion 20A in one-body shape. The second carrier portion 20B has a second carrier face 2002 (i.e., chip mounting area) higher than a first carrier face 2001 of the first carrier portion 20A. Furthermore, as shown in FIG. 8, the metal substrate 20 having the second carrier portion 20B appears like a step structure because the second carrier portion 20B bulges out from the first carrier portion 20A. Thus, a difference in height between the first carrier face 2001 of the first carrier portion 20A and the second carrier face 2002 of the second carrier portion 20B occurs naturally. For example, the first and second carrier faces 2001, 2002 are planar and parallel, and the difference in height H ranges of 50 μm and 550 μm. Preferably, the difference in height H may in the range of 150 μm and 250 μm. The instant disclosure is not limited thereto.

Moreover, the second carrier portion 20B may be formed by etching, stamping or mechanics processing, and the metal substrate 20 having the second carrier portion 20B is formed by single process as mentioned above. In this regard, heat from the light emitting unit 4 can be dissipated more efficiently by the metal substrate 20. Additionally, the metal substrate 20 may be a mirror aluminum substrate exhibiting a reflectivity greater than 95%. For example, the mirror aluminum substrate employed as the metal substrate 20 is fabricated by sputtering or evaporation deposition an Al layer, a TiO2 layer and a SiO$_2$ layer in succession. The high reflectivity and low reflectivity created by sputtering (or evaporation deposition) are stacked in alternative so as to provide a mirror aluminum substrate having a reflectivity higher than 95%. In this regard, the aluminum substrate employed as the metal substrate 20 does not undergo electroplating by silver. Thus, the light degradation caused by sulfatizing can be effectively avoided. Additionally, the mirror aluminum substrate is capable of anti-sulfaltizing and provides high stability in performance and excellent in life span. In other words, the instant embodiment employs the mirror aluminum substrate which exhibits high conductivity and anti-sulfatizing and therefore the LED package can be normally operated under undesired environment conditions such as extremely high or low temperature, great temperature difference, humidity, shock, crash, and high frequency. In general, the product becomes more competitive and the applications are broadened.

Moreover, referring to FIGS. 1-3 and 7-8, the circuit board B having a second thru-hole 220 includes an insulating board 22 and a conductive circuit layer 23, and the circuit board B is disposed on the first carrier face 2001 of the first carrier portion 20A. The insulating board 22 is disposed on the first carrier face of the first carrier portion 20A by means of the adhesive layer 21. The second carrier portion 20B penetrates through the second thru-hole 220 of the circuit board B. The conductive circuit layer 23 is disposed on the insulating board 22 and also surrounds the second carrier portion 20B. Because the adhesive layer 21 is disposed on the first carrier face 2001 and surrounds the second carrier portion 20B, the circuit board B is attached to the first carrier face 2001 of the metal substrate 20 thereby. Also, the solder resist layer 25 (i.e., welding protection area) is disposed on the conductive circuit layer 23 of the circuit board B. A portion of the conductive circuit layer 23 (i.e., wire bonding area) is exposed from the solder resist layer 25 and proximate to the second carrier portion 20B. The conductive circuit layer 23 may be divided into a positive electrode 23P and a negative electrode 23N. Additionally, as shown in FIG. 2, two arc slots are formed on the positive electrode 23P, and two arc slots are formed on the negative electrode 23N such that each of the positive electrode and the negative electrode is divided into an inner arc-shaped conductive circuit and an outer arc-shaped conductive circuit. Each of the arc slots 23 is further formed with at least one position notch 230 which are distal to the second carrier portion yet close to the solder resist layer 25. For example, each position notch 230 may have a V-shaped cut. The opening of the V-shaped cut is toward the solder resist layer 25 while the apex is toward the second carrier portion 20B. In other words, each position notch 230 is positioned close to the solder resist layer 25 and away from the second carrier portion 20B (that is to say each opening of the V-shaped cut faces the solder resist layer 25, the apex is toward the second carrier portion 20B). Furthermore, the presence of the V-shaped cuts of the position notches 230 between the second carrier portion 20B and the conductive circuit layer 23 reduces the occurrence of electric arc. As a result, the high potential (Hipot) capacity for the LED package is improved. Take FIG. 2 for example. The V-shaped cut 230 forms an orthogonal angle. Four arc slots 230 are formed on the conductive circuit layer 23 and sequentially distributed along an outer diameter of the first thru-hole 210 of the insulating board 22 so as to construct a ring-like structure. Especially, the four position notches 230 are located at the four quadrants respectively. The position notches 230 are arranged in two symmetrical pairs taking the centre of the substrate 2 as the symmetrical point. This arrangement also provides indication to the location of the LED chips 40. It is worth mentioning that the configuration of the position notches 230 is not limited to the instant disclosure. The number of the position notches 230 may be two as long as the slots are symmetrically formed by the centre of the substrate 2 on any two positions.

Furthermore, as shown in FIG. 1, the adhesive layer 21, circuit board B and solder resist layer 25 have similar contour, and a first thru-hole 210, a second thru-hole 220 and a third thru-hole 250 are formed respectively thereon for receiving the second carrier portion 20B. Referring to FIGS. 1 and 8, the conductive circuit layer 23 is formed on the insulating board 22 and the adhesive layer 21, the insulating board 22 and the solder resist layer 25 are stacked on the first carrier face 2001 in succession, the first, second and third thru-holes 210, 220, 250 communicate with each other. For example, the conductive circuit layer 23 may be planted on the insulating board 22 firstly. Then the insulating board 22 having conductive circuit layer 23 can be disposed on the first carrier face 2001 of the metal substrate 20 through the adhesive layer 21 by hot pressing. More precisely, the first thru-hole 210 of the adhesive layer 21 is substantially in position corresponding to the second carrier portion 20B of the metal substrate 20, thus the circuit board B can be adhere to the metal substrate 20 through the adhesive layer 21 by hot pressing. Subsequently, the solder resist layer 25 is covered on the conductive circuit layer 23. Refer to FIGS. 2-3 and 8. After the coverage of the solder resist layer 25, only the inner arc-shaped conductive circuits of the conductive circuit layer 23 for wire bonding are exposed from the solder resist layer 25.

The positive and negative electrodes 23P, 23N of the conductive circuit layer 23 are further elaborated herein. Specifically, referring to FIGS. 2 and 3, the positive and negative electrodes 23P, 23N may be arranged along the circumferential portion of the circular second carrier portion 20B. That is to say that the conductive layer 23 forms an annular wiring using the centre of the circular second carrier portion 20B. The positive and negative electrodes 23P, 23N has a plurality of arc slots (230P, 230N) formed along the circumferential portion of the circular second carrier portion 20B. In addition, the positive electrode 23P can be divided into two groups by the plurality of the arc slots 230P: inner arc-shaped conductive circuit 231P which are closer to the second carrier portion 20B or outer arc-shaped conductive circuit 232P which are further away from the second carrier portion 20B. The plurality of arc slots 230P is in between the inner and outer arc-shaped conductive circuits 231P, 232P. Likewise, the negative electrode 23N can be divided into two groups by the plurality of the arc slots 230N: inner arc-shaped conductive circuit 231N which are closer to the second carrier portion 20B or outer arc-shaped conductive circuit 232N which are further away from the second carrier portion 20B. The plurality of arc slots 230N is in between the inner and outer arc-shaped conductive circuits 231N, 232N. Therefore, as shown in FIG. 3, when the solder resist layer 25 is covered on the conductive circuit layer 23, the solder resist layer 25 is only covered on the outer arc-shaped conductive circuit 231N instead of the inner arc-shaped conductive circuit 232N. In other words, the inner arc-shaped conductive circuit 232N is exposed from the solder resist layer 25. The solder resist layer 25 only covers part of the arc slots (230P, 230N) whereas portions of the arc slots (230P, 230N) are exposed. The position notches 230 having V-shaped cut are not covered by the solder resist layer 25. The position notches 230 are formed on the exposed inner arc-shaped conductive circuits 230P, 230N.

Referring to FIGS. 3, and 7-8 The circuit board B and the adhesive layer 21 surround the second carrier portion 20B and are separated from each other by a predetermined distance to form a groove G therebetween. The insulating body 24 is disposed in the groove G to form an insulating barrier between the chip mounting area and the wire bonding area, and a top surface of the insulating body 24 is coplanar with the second carrier surface 2002 of the second carrier portion 20B. In this regard, the second carrier portion 20B and the conductive circuit layer 23 of the circuit board B are effectively electrically insulated. The top face of the insulating body 24 may also reflect the light from the light emitting unit 4 and therefore enhance the reflectivity of the light emitting unit 4. For example, the insulating body 24 can be made of silicone epoxy, polyimide or other solder resist materials. The insulating body 24 (or the groove G) may have a width W for approximately 0.5 mm. However, the instant disclosure is not limited thereto. The solder resist layer 25 and the insulating body 24 may be formed in one process when the insulating body 24 is also made of solder resist materials. Therefore, the fabrication process can be simplified.

Furthermore, refer to FIGS. 1, 4-5B and 7-8. After the metal substrate 20, adhesive layer 21, circuit board B, insulating body 24 and solder resist layer 25 are stacked in succession as shown in FIG. 1 to complete the substrate unit 2, die attaching and wire bonding of the light emitting unit 4 can be performed on the substrate unit 2. Then the reflective frame 5 and the encapsulant 6 are disposed on the substrate unit 2. More specifically, the light emitting unit 4 includes the plurality of LED chips 40 disposed on the second carrier face 2002 of the second carrier portion 20B. The plurality of LED chips 40 are electrically connected to the circuit board B. Further still, the plurality of LED chips 40 are directly disposed on the second carrier portion 20B of the metal substrate 20, and therefore the heat generated by the LED chips 40 can be conducted to the metal substrate 20 immediately. As a result, the heat dissipation efficiency of the instant disclosure is greatly enhanced. For example, referring to FIGS. 7 and 8, the top of each LED chip 40 has a positive electrode and a negative electrode (not shown). In FIG. 8, the plurality of LED chips 40 on the same row can be serial connected by a plurality of wires 41 and are electrically connected to the positive and negative electrodes 23P, 23N of the conductive circuit layer 23 of the circuit board B. Specifically, the second carrier face 2002 of the second carrier portion 20B and the top face 231 of the conductive circuit layer 23 can be coplanar. Thus, when light created by the plurality of LED chips 40 disposed on the second carrier face 2002 of the second carrier portion 20B emits, the light path is not blocked by the circuit board B and the light intensity remains its integrity. The brightness of the LED package is not compromised or hindered by its structure. In other words, because the chip mounting area and wire bonding area of the instant disclosure can be coplanar without any difference in height, the brightness remains its integrity. Hence, the LED chips 40 provide sufficient and complete light and the overall brightness of the LED package achieves a higher level.

Refer to FIGS. 3-8. The reflective frame 5 is disposed on the circuit board B and surrounds the LED chips 40. The encapsulant 6 encapsulates the LED chips 40 and is surrounded by the reflective frame 5. The reflective frame 5 may be attached to the conductive circuit layer 23 by dispensing or molding, and the encapsulant 6 can be disposed within the reflective frame 5. Specifically, the reflective frame 5 can be formed on the conductive circuit layer 23 which is exposed from the solder resist layer 25 and the encapsulant 6 is confined within the reflective frame 5 such that the coverage and the amount of encapsulant 6 can be under control. For example, the reflective frame 5 and the encapsulant 6 are made of silicone resin or epoxy resin. The reflective frame 5 is a non-transparent frame which is capable of reflecting the light coming from the LED chips 40. The encapsulant 6 may be a transparent resin or a fluorescent material mixed within the transparent resin. The instant embodiment is not intended to limit the instant disclosure. Moreover, referring to FIG. 3 in conjunction with FIG. 5B, when the reflective frame 5 is disposed on the circuit board B and surrounding the light emitting unit 4, the reflective frame 5 just falls on the boundary of the solder resist layer 25 and the conductive circuit layer 23. The contact area between the reflective frame 5 and the conductive circuit layer 23 are increased because portions of the arc slots (230P, 230N) are exposed. This arrangement increases the combination between the reflective frame 5 and the conductive circuit layer 23. Thus, when an external force is enforced, the instant disclosure can greatly reduce the peeling of the reflective frame 5 from the conductive circuit layer 23. Furthermore, as shown in FIG. 5B, the reflective frame 5 does not completely cover the inner arc-shaped conductive circuits 231P, 231N. The uncovered inner arc-shaped conductive circuits 231P, 231N can be provided for wire bonding for LED chips 40.

Figure 9A:
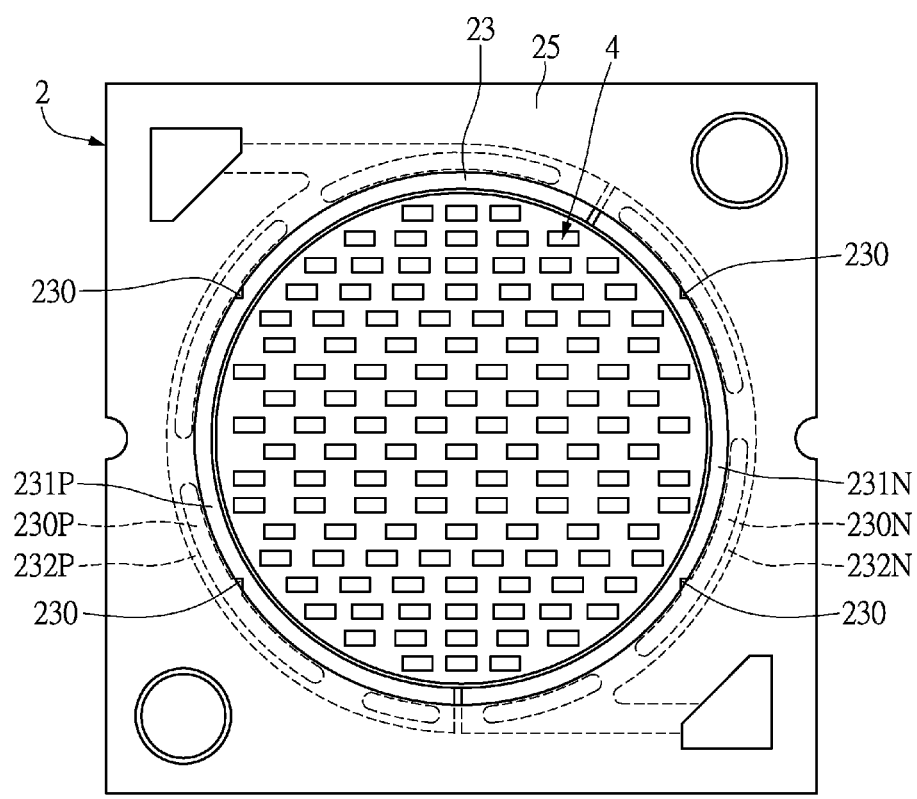
FIG. 9A is a top schematic view illustrating the LED package that the encapsulant and the reflective frame are omitted for clarity.
Figure 9B:
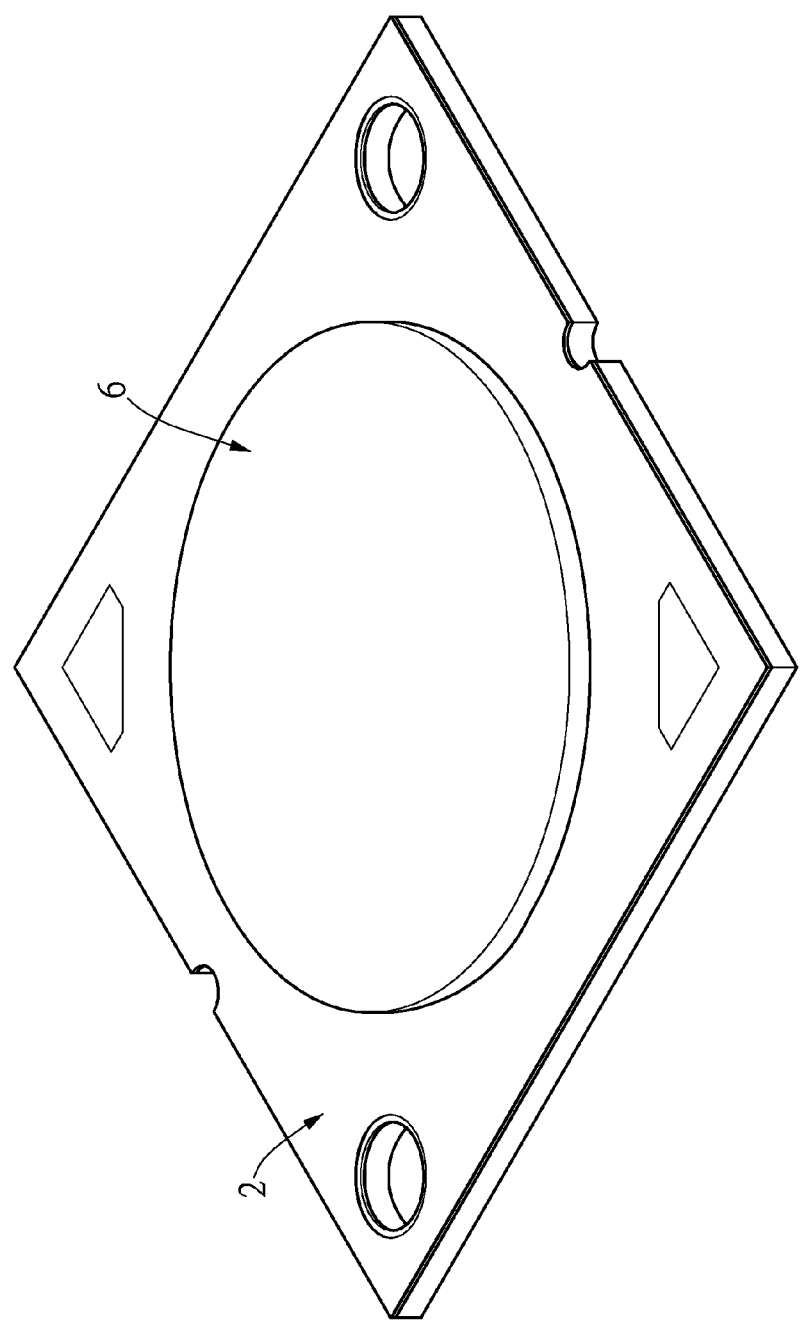
FIG. 9B is a perspective view illustrating the LED package that the reflective frame is omitted for clarity.

In another embodiment, as shown in FIGS. 9A and 9B, the reflective frame 5 may be omitted in the LED package. Instead, the encapsulant 6 is formed on top of the light emitting unit 4 by molding and the LED chips 40 are then encapsulated. As shown in FIG. 9A, when the solder resist layer 25 covers the conductive circuit layer 23, the solder resist layer 25 covers the entire outer arc-shaped conductive circuits (232P, 232N) and the entire arc slots (230P, 230N) whereas the inner arc-shaped conductive circuits (231P, 231N) are uncovered (or only slightly shielded). That is to say, only the inner arc-shaped conductive circuits (231P, 231N) are exposed from the solder resist layer 25 for wire bonding of the LED chips 40.

Second Embodiment

Figure 10:
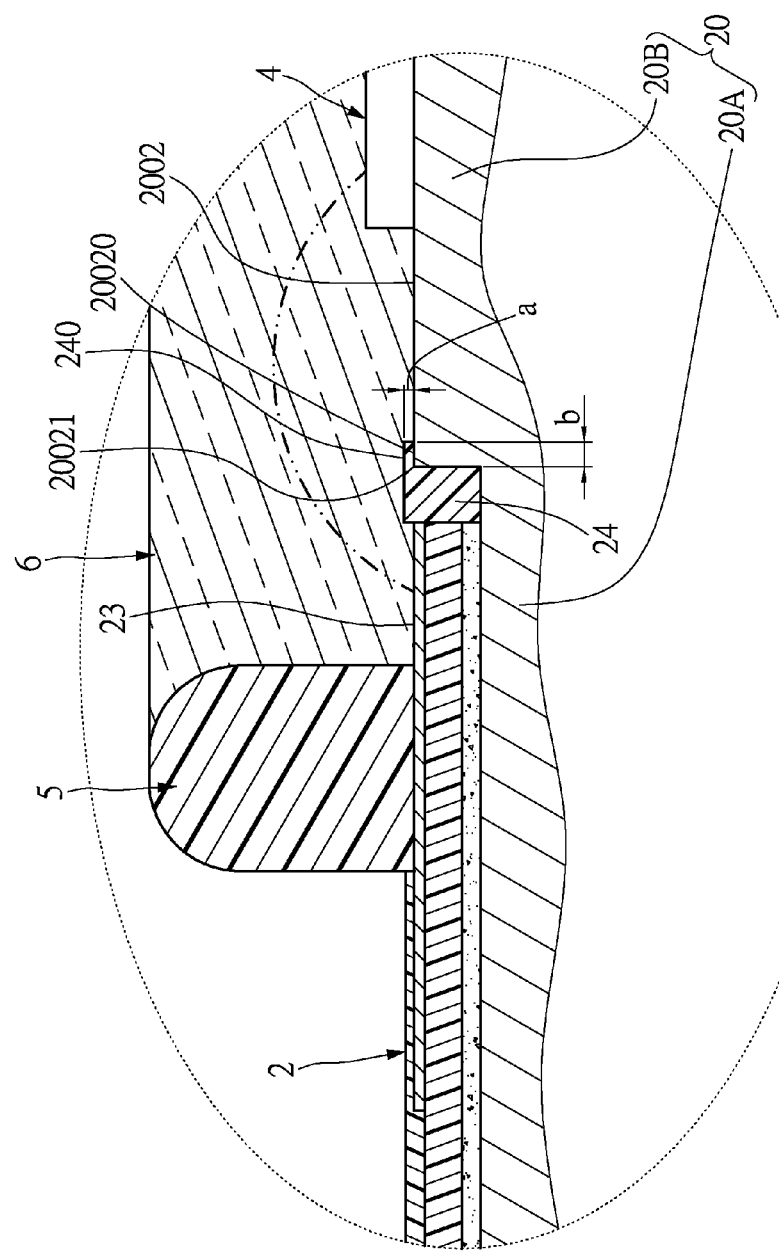
FIG. 10 is an enlarged view illustrating a second embodiment of the instant disclosure.

Refer to FIG. 10. FIG. 10 is an enlarged view of another insulating body 24 of the instant disclosure. Comparing FIG. 10 to FIG. 8, the major difference between the first and second embodiment is the insulating body 24. In the second embodiment, the insulating body 24 is formed with a flange 240 which covers the top peripheral 20020 of the second carrier face 2002 of the second carrier portion 20B and is extended to the second carrier surface 2002 of the second carrier portion 20B. Specifically, the flange 240 of the insulation body 24 completely covers the corner 20021 of the second carrier portion 20B, and therefore the electric arc is reduced between the corner 20021 of the second carrier portion 20B and the conductive circuit layer 23 of the circuit board B. The overall hipot is therefore greatly enhanced. For example, the thickness a and width b of the flange 240 may be larger than 1 mil and 5 mil respectively and the instant disclosure is not limited thereto.

Third Embodiment

Figure 11:
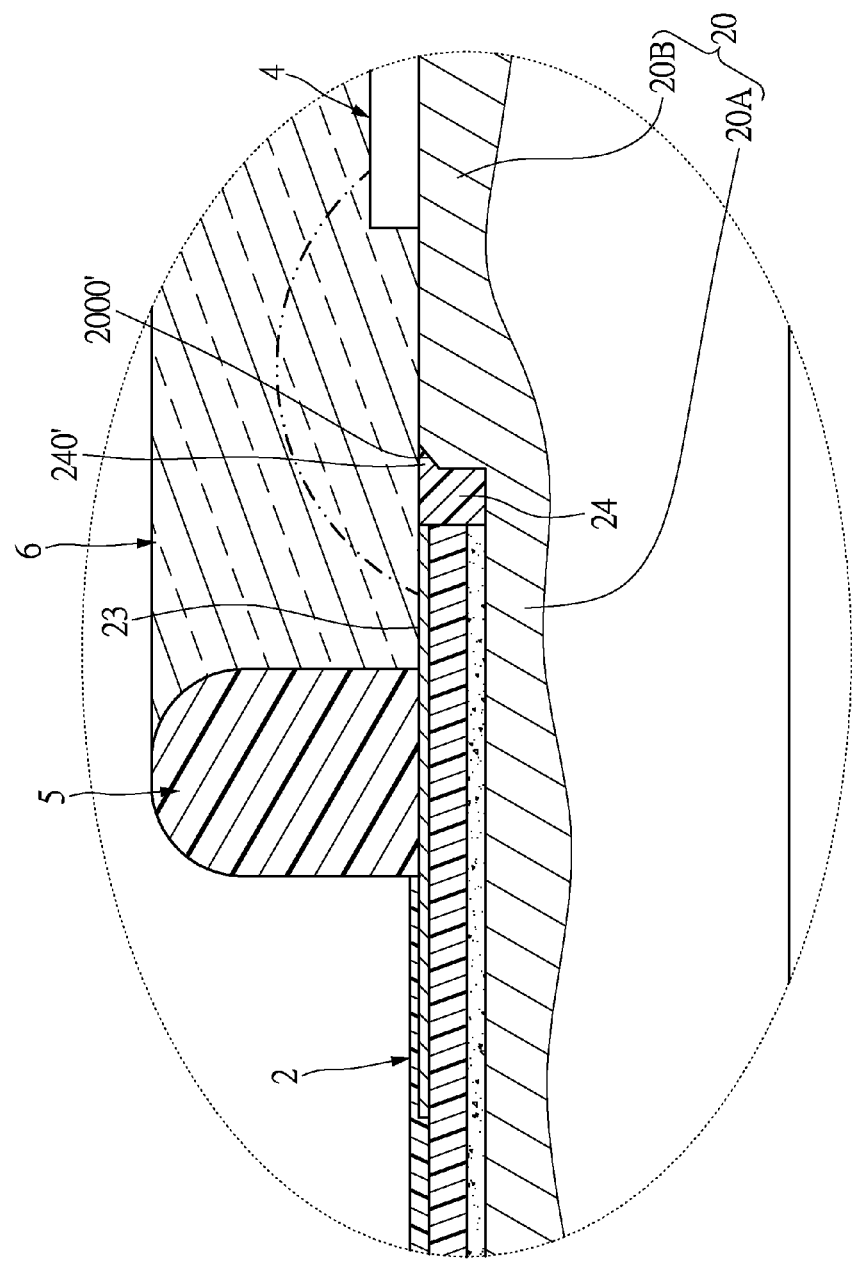
FIG. 11 is an enlarged view illustrating a third embodiment of the instant disclosure.

Refer to FIG. 11, showing an enlarged view of still another insulating body 24. Comparing FIG. 11 with FIG. 8, the major difference between the first and third embodiment is also the insulating body 24. In the third embodiment, the top peripheral of the second carrier portion 20B is formed with a truncated edge 2000'. The insulating body 24 is formed with a flange 240' conformingly enveloping the truncated edge 2000'. Furthermore, in the third embodiment, the corner 20021 (as shown in FIG. 10) of the second carrier portion 20B is truncated and the truncated edge 2000' is completely covered by the flange 240'. In this regard, the electric arc between the second carrier portion 20B and the conductive circuit layer 23 of the circuit board B is reduced. The overall hipot is also enhanced. For example, the truncated edge 2000' may be formed to a specific angle (as shown in FIG. 11), round corner or step and the configuration of the flange 240' conformingly changes accordingly. However, the instant disclosure is not limited to the configuration of the instant embodiment.

In summary, the plurality of LED chips 40 can be disposed on the second carrier portion 20B of the metal substrate 20 directly, such that the heat generated by the LED chips 40 passes through the metal substrate 20 to be dissipated instead of passing through the insulating board 22 and the conductive circuit layer 23. Hence heat dissipation of the LED chips 40 can be facilitated by the metal substrate 20.

Furthermore, the metal substrate 20 is made of the mirror aluminum substrate which does not undergo silver electroplating. The degradation of light which is caused by sulfurization can be avoided and the life span of the product is prolonged.

The second carrier face 2002 (i.e., chip mounting area) of the second carrier portion 20B is coplanar to the top face 231 (i.e., welding area) of the conductive circuit layer 23 without any level difference, and therefore the brightness remains its integrity. That is to say, given the same number of LED chips 40, the instant disclosure provides a brighter view.

The electric arc occurrence between the second carrier portion 20B and the conductive circuit layer 23 is effectively reduced and the overall hipot is promoted. Three reasons contribute to the improvement. Firstly, each arc slit 230 are proximate to the solder resist layer 25 while distal to the second carrier portion 20B. Secondly, the flange 240 of the insulating body 24 completely envelopes the corner 20021 of the second carrier portion 20B. Thirdly, if the corner 20021 of the second carrier portion 20B is truncated, the flange 240 is reconfigured to conform to the truncated edge 2000'.

Further still, the contacting area between the reflective frame 5 and the conductive circuit layer 23 increases in relation to the design of the arc slots (230P, 230N). The increased contacting area enhances the attachment between the reflective frame 5 and the conductive circuit layer 23. Therefore the reflective frame 5 is less likely to fall off the conductive circuit layer 23 when encountering shocks.

The overall structure of the LED package prevents moisture from invading the chip mounting area and the materials are also preserved. The product exhibits reliable air tightness.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A light emitting diode (LED) package, comprising:
   a substrate unit including
      a metal substrate having a first carrier portion and a second carrier portion, the second carrier portion projected from the first carrier portion, the first carrier portion including a first carrier surface, the second carrier portion including a second carrier surface, the second carrier surface being higher than the first carrier surface; and
      a circuit board having a thru-hole and disposed on the first carrier surface of the first carrier portion, and the second carrier portion penetrating through the thru-hole of the circuit board;
   a light emitting unit including at least one LED chip, the LED chip disposed on the second carrier surface of the second carrier portion and electrically connected to the circuit board; and
   an encapsulant encapsulating the light emitting unit;
   wherein the metal substrate is a mirror aluminum substrate, a reflectivity of the mirror aluminum substrate is more than 95%.

2. The LED package according to claim 1, wherein the first carrier surface and the second carrier surface are parallel with each other, and a height difference between the first carrier surface and the second carrier surface is in range of 50 μm and 550 μm.

3. The LED package according to claim 1, the circuit board including
   an insulating board having the thru-hole; and
   a conductive circuit layer having a positive electrode and a negative electrode, the positive electrode and the negative electrode separately disposed on the insulating board and distributed around the thru-hole of the insulating board.

4. The LED package according to claim 3, wherein at least one arc slot is disposed on one of the positive electrode and the negative electrode so as to divide the positive electrode or the negative electrode into an inner arc-shaped conductive circuit and an outer arc-shaped conductive circuit.

5. The LED package according to claim 3 wherein the substrate unit further including:
   a solder resist layer having a thru-hole and disposed on the circuit board, an inner arc-shaped conductive circuit of the positive electrode and an inner arc-shaped conductive circuit of the negative electrode are exposed from the thru-hole of the solder resist layer.

6. The LED package according to claim 3, wherein a plurality of arc slots are disposed on the conductive circuit layer, the plurality of arc slots are sequentially distributed along contours of the thru-hole of the insulating board so as to construct a ring-like structure.

7. The LED package according to claim 1, wherein the substrate unit further includes an adhesive layer disposed between the circuit board and the metal substrate for adhering the circuit board to the metal substrate.

8. The LED package according to claim 7, wherein the adhesive layer further comprises a thru-hole, the thru-hole of the adhesive layer is substantially in position corresponding to the second carrier portion of the metal substrate.

9. The LED package according to claim 3, wherein the second carrier surface of the second carrier portion and a top surface of the conductive circuit layer is coplanar.

10. The LED package according to claim 3, wherein the conductive circuit layer is formed with a plurality of position notches distal to the second carrier portion while proximate to a solder resist layer.

11. The LED package according to claim 1, wherein the circuit board surrounds the second carrier portion with a predetermined distance so as to define a round groove therebetween.

12. The LED package according to claim 11, wherein the substrate unit further includes an insulating body disposed in the round groove.

13. The LED package according to claim 12, wherein a top surface of the insulating body is coplanar with the second carrier surface of the second carrier portion.

14. The LED package according to claim 12, wherein the insulating body further comprises a flange extending to the second carrier surface of the second carrier portion.

15. The LED package according to claim 14, wherein the flange of the insulating body covers a corner of the second carrier portion.

16. The LED package according to claim 12, wherein a corner of the second carrier portion is truncated to form a truncated edge, the insulating body is filled within the truncated edge.

17. The LED package according to claim 16, wherein a top surface of the insulating body is coplanar with the second carrier surface of the second carrier portion.

18. The LED package according to claim 1, further comprising a reflective frame disposed on the circuit board and surrounding the LED chip.

* * * * *